United States Patent
Hsieh et al.

(10) Patent No.: US 8,722,538 B2
(45) Date of Patent: May 13, 2014

(54) METHOD FOR FORMING CONTACT WINDOW

(75) Inventors: Jung-Yuan Hsieh, Hsinchu (TW);
Shih-Hsi Chen, Hsinchu County (TW);
Jin-Ren Han, Hsinchu (TW)

(73) Assignee: Powerchip Technology Corporation, Hsinchu (TW)

( * ) Notice: Subject to any disclaimer, the term of this patent is extended or adjusted under 35 U.S.C. 154(b) by 0 days.

(21) Appl. No.: 13/610,913

(22) Filed: Sep. 12, 2012

(65) Prior Publication Data
US 2014/0011357 A1    Jan. 9, 2014

(30) Foreign Application Priority Data
Jul. 3, 2012    (TW) .............................. 101123908 A

(51) Int. Cl.
*H01L 21/768*    (2006.01)

(52) U.S. Cl.
USPC ............................. 438/675; 438/637; 438/639

(58) Field of Classification Search
None
See application file for complete search history.

(56) References Cited

U.S. PATENT DOCUMENTS

| | | | |
|---|---|---|---|
| 6,573,168 B2 * | 6/2003 | Kim et al. ..................... | 438/586 |
| 6,821,872 B1 * | 11/2004 | Liao et al. ..................... | 438/586 |
| 7,049,225 B2 * | 5/2006 | Lee ................................ | 438/637 |
| 7,365,000 B2 * | 4/2008 | Lee et al. ...................... | 438/618 |
| 2002/0001889 A1 * | 1/2002 | Kim et al. ..................... | 438/183 |
| 2002/0137331 A1 * | 9/2002 | Chang ........................... | 438/637 |
| 2004/0166667 A1 * | 8/2004 | Lee ................................ | 438/637 |
| 2005/0056899 A1 * | 3/2005 | Rendon et al. ................ | 257/408 |
| 2005/0074965 A1 * | 4/2005 | Lee et al. ...................... | 438/627 |
| 2005/0112869 A1 * | 5/2005 | Lee et al. ...................... | 438/631 |
| 2006/0073699 A1 * | 4/2006 | Lee et al. ...................... | 438/639 |
| 2006/0148227 A1 * | 7/2006 | Kronke et al. ................ | 438/586 |
| 2007/0032086 A1 * | 2/2007 | Furukawa et al. ............ | 438/706 |
| 2007/0082477 A1 * | 4/2007 | Naik et al. .................... | 438/622 |
| 2007/0114631 A1 * | 5/2007 | Sato et al. ..................... | 257/506 |
| 2008/0067604 A1 * | 3/2008 | Bach ............................. | 257/368 |
| 2008/0149989 A1 * | 6/2008 | Cheng et al. .................. | 257/316 |
| 2008/0160693 A1 * | 7/2008 | Sim et al. ...................... | 438/261 |
| 2008/0248410 A1 * | 10/2008 | Wu ................................ | 430/7 |
| 2009/0027964 A1 * | 1/2009 | Arai .......................... | 365/185.05 |
| 2010/0316949 A1 * | 12/2010 | Rahman et al. ............ | 430/270.1 |
| 2012/0156855 A1 * | 6/2012 | Sim ................................ | 438/421 |

* cited by examiner

*Primary Examiner* — Charles Garber
*Assistant Examiner* — Stanetta Isaac
(74) *Attorney, Agent, or Firm* — Jianq Chyun IP Office

(57) ABSTRACT

A method for forming a contact window includes: a step of providing a substrate; a step of forming a patterned amorphous carbon layer or spin-on coating layer, in which a surface of the substrate is exposed at two sides of the amorphous carbon layer or spin-on coating layer; a step of forming an interlayer dielectric layer on the substrate; a step of removing a portion of the interlayer dielectric layer until the patterned amorphous carbon layer or spin-on coating layer is exposed; a step of removing the patterned amorphous carbon layer or spin-on coating layer to form an opening; and a step of filling the opening with a conductive material to form the contact window.

19 Claims, 4 Drawing Sheets

METHOD FOR FORMING CONTACT WINDOW

CROSS-REFERENCE TO RELATED APPLICATION

This application claims the priority benefit of Taiwan application serial no. 101123908, filed on Jul. 3, 2012. The entirety of the above-mentioned patent application is hereby incorporated by reference herein and made a part of this specification.

BACKGROUND OF THE INVENTION

1. Field of the Invention

The present invention relates to a method for forming a semiconductor device, and more particularly to a method for forming a contact window.

2. Description of Related Art

Non-volatile memory device allows multiple and repetitive writing, reading and erasure operations, and the stored data is retained even when power is cut off. Hence the non-volatile memory device has become widely used in personal computers and electronic equipments.

A typical non-volatile memory device includes a plurality of select transistors and a plurality of memory cells. In general, the memory cell is designed to have a stacked-gate structure, and the stacked-gate structure includes a tunneling dielectric layer, a floating gate, an inter-gate dielectric layer and a control gate. The select transistor generally has a select gate and a gate dielectric layer. In order to electrically connect the select transistors to bit lines, an opening is usually formed between the select transistors and the opening is filled with a conductive material to form a contact window, thereby electrically connecting the select gates of the select transistors to the bit lines.

Nonetheless, a common way to increase storage capacity of a memory device is to increase the number of memory cells per unit of volume in the memory. However, the increased number of memory cells causes increased component density in the memory. With respect to an NAND gate memory, distance between the select gates becomes smaller and smaller. When the contact window is formed between the select gates, there is need to form the contact window opening with a large height-width ratio; in cases where conventional methods for forming a contact window are used, a contact window opening having an under-cut or side-etch/bowing profile may be obtained, and consequently, a major axis direction of the contact window is not perpendicular to a surface of a substrate to be electrically connected. Such under-cut or side-etch/bowing profile may result in formation of seams in some portions in the contact window opening which are not filled with tungsten after a step of filling the tungsten in the contact window opening during the subsequent fabrication processes. As a result, a resistance of the contact window is enhanced, and adverse effects arise. In addition, with reduced device density, the contact window having a side-etch/bowling profile may cause short circuits between adjacent select gates or bit-line contact windows.

SUMMARY OF THE INVENTION

In view of the above, the present invention provides a method for forming a contact window. A major axis direction of the contact window obtained by the method is almost perpendicular to a substrate surface, and the contact window does not have an under-cut or side-etch/bowing profile. Therefore, short circuits between select gates and between bit-line contact windows in a memory, as a result of reduced size, do not easily occur.

The present invention proposes a method for forming a contact window and the method includes the following steps. A substrate is provided. A patterned amorphous carbon layer (a-c) or spin-on coating layer (SOHM+UL) is formed on the substrate. A surface of the substrate is exposed at two sides of the amorphous carbon layer or spin-on coating layer. An interlayer dielectric layer is formed on the substrate. A portion of the interlayer dielectric layer is removed to expose the patterned amorphous carbon layer or spin-on coating layer. The patterned amorphous carbon layer or spin-on coating layer is removed to form an opening. The opening is filled with a conductive material to form a contact window.

In an embodiment of the present invention, the method further includes forming at least an anti-reflection layer on the substrate.

In an embodiment of the present invention, the method further includes forming a liner layer on the substrate after forming the patterned amorphous carbon layer or spin-on coating layer and before forming the interlayer dielectric layer on the substrate.

In an embodiment of the present invention, a method for removing a portion of the interlayer dielectric layer to expose the patterned amorphous carbon layer or spin-on coating layer includes a chemical mechanical polishing method.

In an embodiment of the present invention, the spin-on coating layer includes a spin on hard mask (SOHM) layer and an under layer (UL).

In an embodiment of the present invention, a material of the interlayer dielectric layer includes silicon oxide, silicon nitride, or silicon oxynitride.

In an embodiment of the present invention, a material of the anti-reflection layer includes silicon oxynitride.

In an embodiment of the present invention, a material of the conductive material is tungsten metal.

In an embodiment of the present invention, a material of the liner layer includes an oxide layer or silicon nitride layer formed by an atomic layer forming method.

The present invention proposes a method for forming a contact window of a memory, and the method includes the following steps. A substrate is provided, and the substrate has a plurality of select gates of a memory formed thereon. A patterned amorphous carbon layer or spin-on coating layer is formed between the select gates. An interlayer dielectric layer is formed on the substrate. A portion of the interlayer dielectric layer is removed to expose the patterned amorphous carbon layer or spin-on coating layer. The patterned amorphous carbon layer or spin-on coating layer is removed to form an opening. The opening is filled with a conductive material to form a contact window between the select gates.

In an embodiment of the present invention, the method further includes forming at least an anti-reflection layer on the substrate.

In an embodiment of the present invention, the method further includes forming a liner layer on the substrate after forming the patterned amorphous carbon layer or spin-on coating layer between the select gates, and before forming the interlayer dielectric layer on the substrate.

In an embodiment of the present invention, a method for removing a portion of the interlayer dielectric layer to expose the patterned amorphous carbon layer or spin-on coating layer includes a chemical mechanical polishing method.

In an embodiment of the present invention, a method for forming the patterned amorphous carbon layer or spin-on coating layer between the select gates includes the following steps. The amorphous carbon layer or spin-on coating layer is formed on the substrate. The amorphous carbon layer or spin-on coating layer is patterned to be formed between the select gates.

In an embodiment of the present invention, the spin-on coating layer includes a spin on hard mask (SOHM) layer and an under layer (UL).

In an embodiment of the present invention, a material of the interlayer dielectric layer includes SOD and BPSG.

In an embodiment of the present invention, a material of the anti-reflection layer includes silicon oxynitride.

In an embodiment of the present invention, a material of the conductive material is tungsten metal.

In an embodiment of the present invention, a material of the liner layer includes an oxide layer or silicon nitride layer formed by an atomic layer forming method.

In the contact window manufactured by the method for forming a contact window of the present invention, the major axis direction is almost perpendicular to a substrate surface, and moreover, the contact window does not have any under cut or side etch. Therefore, short circuits between select gates and between bit-line contact windows in the memory, as a result of reduced size, are decreased.

Based on the above, the method for forming a contact window of the present invention is applicable not only to formation of the contact window in a memory, but also to formation of the contact window in common semiconductor fabrication processes. Furthermore, in the contact window formed by the method, the major axis direction is almost perpendicular to a substrate surface, and the contact window does not have an under-cut or side-etch/bowing profile. Therefore, short circuits between select gates and between bit-line contact windows in the memory, as a result of reduced size, do not easily occur.

In order to make the aforementioned features and advantages of the present invention more comprehensible, embodiments accompanied with figures are described in detail below.

DETAILED DESCRIPTION OF THE INVENTION

The present invention provides a method for forming a contact window, and an explanation is provided below by using semiconductor fabrication as an example.

FIG. 1A to FIG. 1D are cross-sectional schematic drawings of a method for forming a contact window of a memory according to an embodiment of the present invention.

Figure 1A:
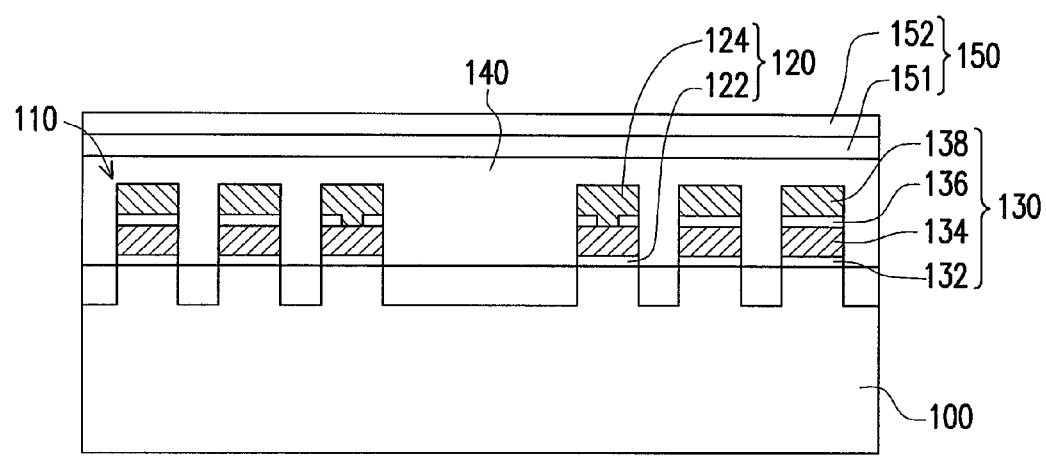
FIG. 1A to FIG. 1D are cross-sectional schematic drawings of a method for forming a contact window of a memory according to an embodiment of the present invention.

Referring to FIG. 1A, first, a substrate 100 is provided. The substrate 100 has a memory 110 formed thereon. The memory 110 is, for example, an NOR type or an NAND type memory. The memory 110 includes a plurality of select transistors 120 and a plurality of memory cells 130. The select transistor 120 includes a gate dielectric layer 122 and a select gate 124. The memory cell 130 includes a tunneling dielectric layer 132, a floating gate 134, an inter-gate dielectric layer 136, and a control gate 138.

Next, an amorphous carbon layer or spin-on coating layer 140 is formed on the substrate 100. The amorphous carbon layer is formed by conventional methods such as a chemical vapor deposition method. The spin-on coating layer is formed by, for example, a spin coating method. The spin-on coating layer includes an SOHM layer and an under layer (UL). The SOHM layer includes organic materials of silicon, carbon, hydrogen and oxide, wherein a content of silicon is 15%~60% and a total content of carbon, hydrogen and oxide is 40%~85%. A thickness of the SOHM layer is 30 nm~80 nm. In the under layer, a content of carbon is 40%~70%, a content of hydrogen is 30%~70% and a content of oxide is 2%~10%. A thickness of the under layer is 120 nm~800 nm. Specifically, a material of the spin-on coating layer is, for example, a spin-on coating material (product name: SHB series (e.g. SHBA940) for SOHM; ODL series (e.g. ODL101) for UL) manufactured by Shin-Etsu Chemical Co., Ltd. or a spin-on coating material (product name: NCH series for SOHM; NCA series for UL) manufactured by Nissan Chemical Ind., Ltd. A formed thickness of the amorphous carbon layer or spin-on coating layer 140 is properly selected depending on a height of the contact window to be formed.

Next, still referring to FIG. 1A, at least an anti-reflection layer 150 is formed on the substrate 100 depending on needs. There is no limitation on a method for forming the anti-reflection layer 150, and the method is properly selected depending on a material of the anti-reflection layer 150. In an embodiment, the anti-reflection layer 150 includes a multi-layer anti-reflection layer 151 and a bottom anti-reflection layer 152, wherein the bottom anti-reflection layer 152 is formed on the multilayer anti-reflection layer 151. A material of the multilayer anti-reflection layer 151 is, for example, silicon oxynitride or silicon carbide. The multilayer anti-reflection layer 151 is formed by, for example, a chemical vapor deposition method. A material of the bottom anti-reflection layer 152 is, for example, Nissan ARC 176. The bottom anti-reflection layer 152 is formed by, for example, a spin coating method or a roll coating method.

Figure 1B:
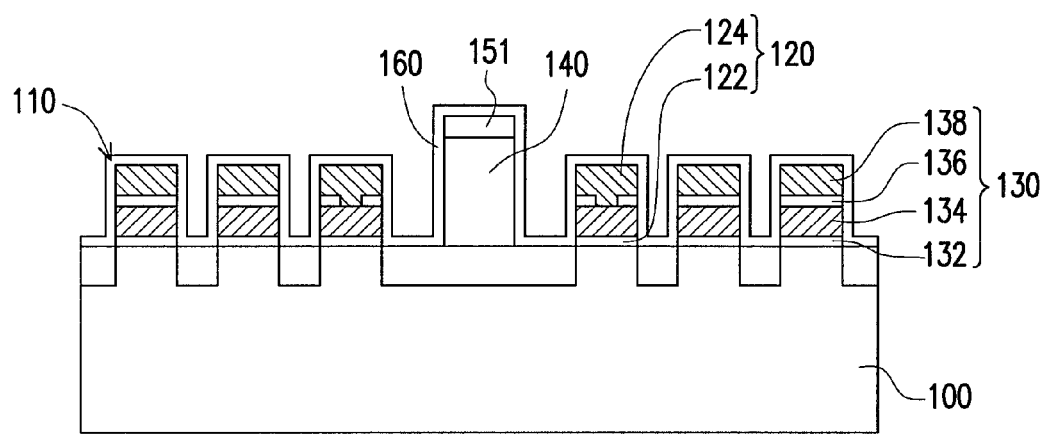

Then, referring to FIG. 1B, the amorphous carbon layer or spin-on coating layer 140 is patterned, such that the patterned amorphous carbon layer or spin-on coating layer 140 is located between the select gates 120. There is no specific limitation on a method for patterning the amorphous carbon layer or spin-on coating layer 140, a lithography method, for example, is employed. In an embodiment, a photoresist (not illustrated) is formed between the select transistors 120 and on the bottom anti-reflection layer 152, so as to define and protect a position of the contact window to be formed. Then, exposure is performed, and etching is performed on the bottom anti-reflection layer 152, the multilayer anti-reflection layer 151 and the amorphous carbon layer or spin-on coating layer 140 not covered by the photoresist. Next, the photoresist and the bottom anti-reflection layer 152 are removed, so as to obtain the patterned amorphous carbon layer or spin-on coating layer 140. Here, the multilayer anti-reflection layer 151 may not be removed and remains on the amorphous carbon layer or spin-on coating layer 140. The multilayer anti-reflection layer 151 may be removed together with removal of a portion of an interlayer dielectric layer as described later. In this way, the fabrication process steps are reduced and the fabrication cost is lowered.

After that, still referring to FIG. 1B, to obtain higher insulating property between the formed contact window and a later-described interlayer dielectric layer, a liner layer 160 is formed on the substrate 100. The liner layer 160 is, for example, an oxide layer or a silicon nitride layer. The liner layer 160 is formed by, for example, an atomic layer forming method. The formed liner layer 160 covers the substrate 100, the patterned amorphous carbon layer or spin-on coating layer 140, and the multilayer anti-reflection layer 151.

Figure 1C:
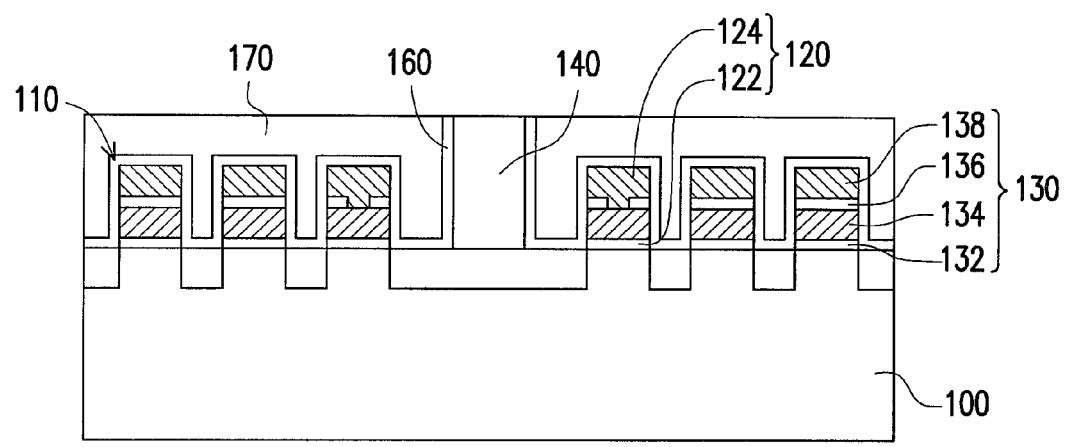

Next, referring to FIG. 1C, an interlayer dielectric layer 170 is formed on the substrate 100. A material of the interlayer dielectric layer 170 is, for example, SOD and BPSG. A surface of the formed interlayer dielectric layer 170 has to be higher than the patterned amorphous carbon layer or spin-on coating layer 140. Then, a portion of the interlayer dielectric layer 170 is removed to expose the patterned amorphous carbon layer or spin-on coating layer 140. A method for removing a portion of the interlayer dielectric layer 170 is, for example, a chemical mechanical polishing method. Specifically, the chemical mechanical polishing method is utilized to polish from the surface of the interlayer dielectric layer 170, and the polishing continues until a surface of the patterned amorphous carbon layer or spin-on coating layer 140 is exposed. During this stage, since the multilayer anti-reflection layer 151 is located on the patterned amorphous carbon layer or spin-on coating layer 140, the multilayer anti-reflection layer 151 is removed before the surface of the patterned amorphous carbon layer or spin-on coating layer 140 is exposed.

Figure 1D:
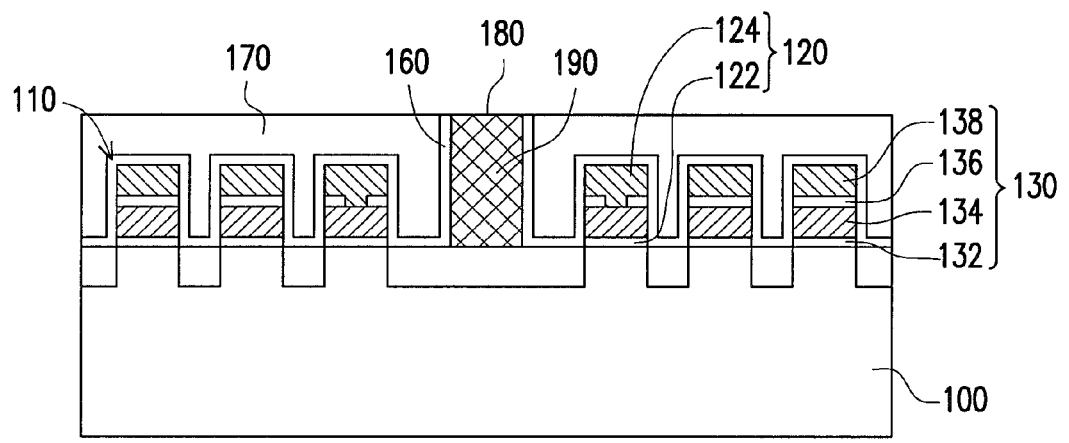
Figure 2A:
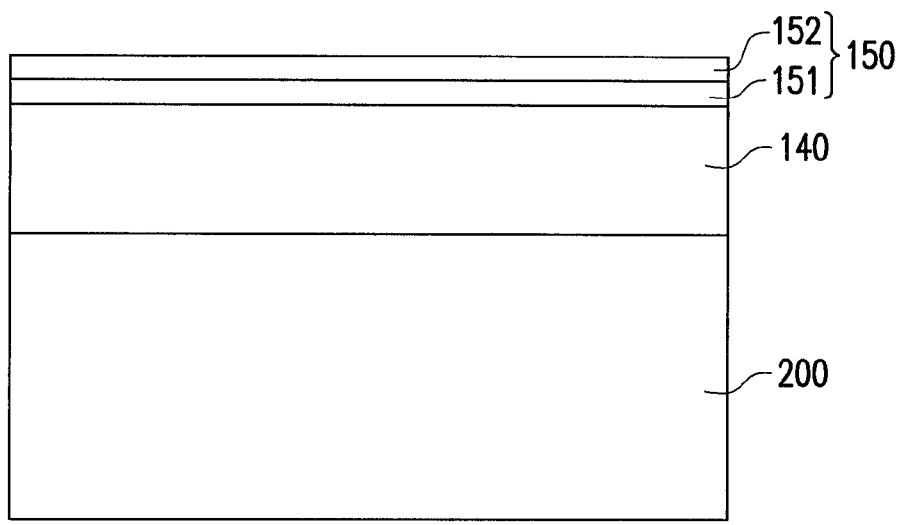
FIG. 2A to FIG. 2D are cross-sectional process drawings of a method for forming a contact window according to another embodiment of the present invention.
Figure 2B:
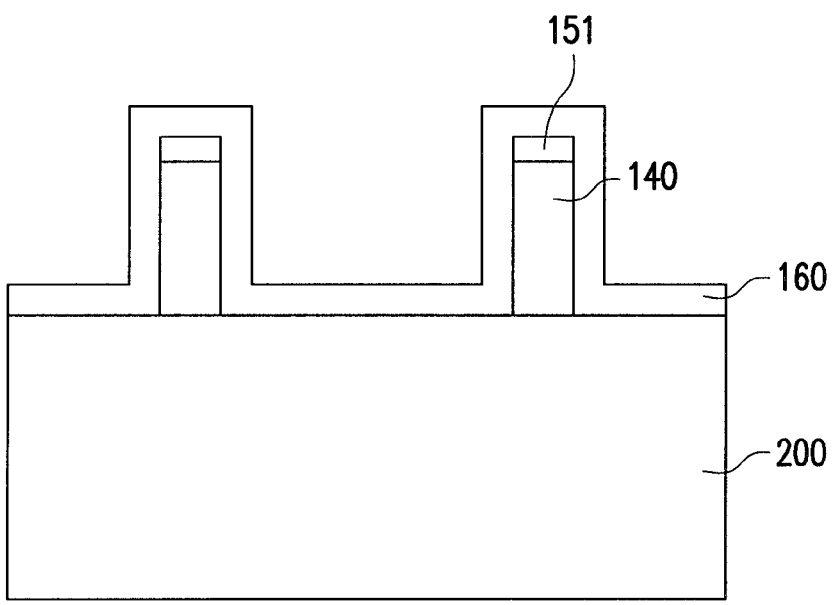
Figure 2C:
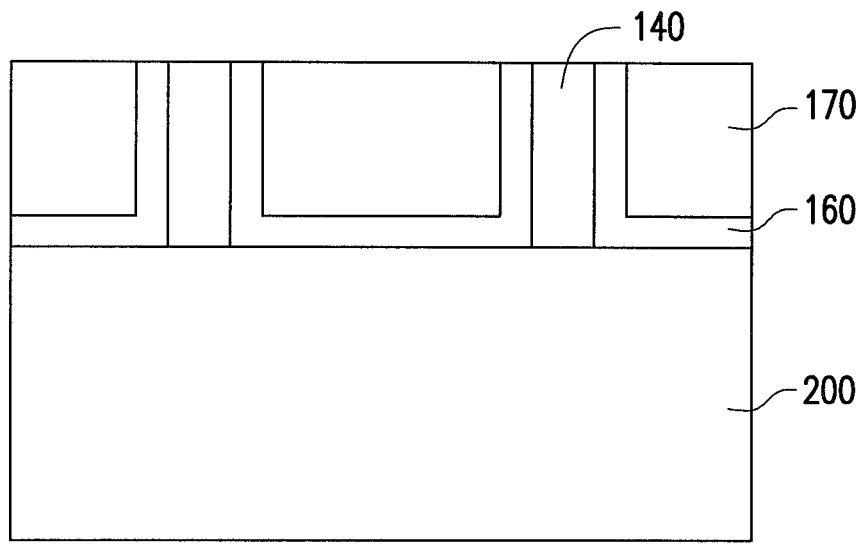
Figure 2D:
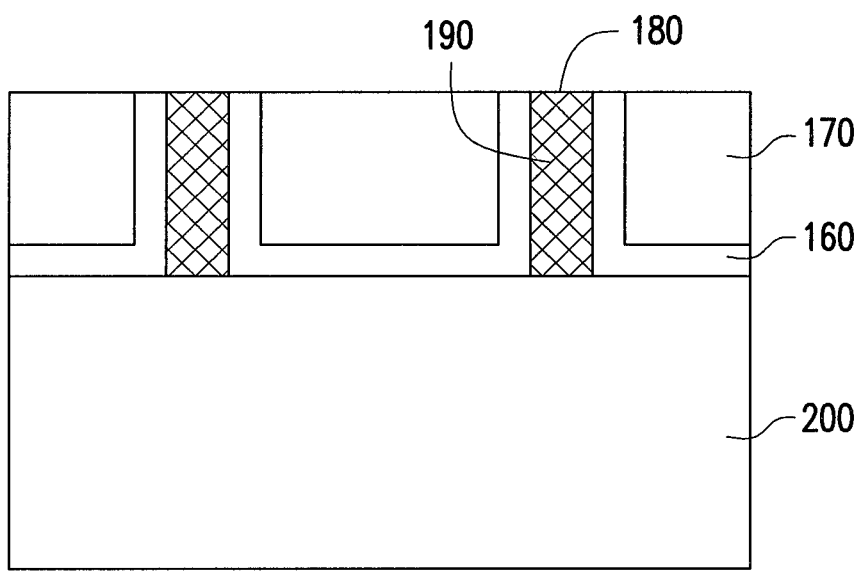

After that, referring to FIG. 1D, the patterned amorphous carbon layer or spin-on coating layer 140 is removed to form an opening 180. There is no specific limitation on the removing method. The removal is performed by, for example, a wet etching method or a dry etching method. The dry etching method is, for example, a plasma etching method or a reactive ion etching method. In the case of using the wet etching method, an enchant which easily etches the amorphous carbon layer or spin-on coating layer 140 but hardly etches the liner layer 160 or the interlayer dielectric layer 170 is preferably selected. Next, the opening 180 is filled with a conductive material to form a contact window 190. A method for filling the conductive material is, for example, a physical vapor deposition method, a chemical vapor deposition method, a sputtering method, an evaporation method and so on. The conductive material is, for example, tungsten metal. An angle between a major axis direction of the formed contact window 190 and a substrate surface is roughly 90 degrees. Moreover, a height of a seam formed in the contact window 190 is lower than a top end of the select gate 124. To enhance adhesive force between the filled conductive material and the substrate 100, the liner layer 160 or the interlayer dielectric layer 170, an adhesion layer (not illustrated) is formed on the substrate 100 before the opening 180 is filled with the conductive material. A material of the adhesion layer is, for example, titanium metal or chromium metal.

The present invention defines a position of the contact window to be formed by utilizing the amorphous carbon layer or spin-on coating layer, then removes the amorphous carbon layer or spin-on coating layer to form the opening, and finally, fills the opening with the conductive material to form the contact window. In the manufactured contact window, the major axis direction is almost perpendicular to the substrate surface, and the contact window does not have an under-cut or side-etch/bowing profile. Therefore, short circuits between select gates and between bit-line contact windows in the memory, as a result of reduced size, do not easily occur.

The above is to apply the method for forming a contact window in the present invention to formation of the contact window in a memory. However, the present invention is not limited thereto. The method for forming a contact window in the present invention is also applicable to formation of the contact window in common semiconductor fabrication processes.

FIG. 2A to FIG. 2D are cross-sectional process drawings of a method for forming a contact window according to another embodiment of the present invention.

In FIG. 2A to FIG. 2D, the components identical to those in the above embodiment are referred to by the same numerals. The components denoted by the same numerals have the same materials and functions. A method for forming a contact window according to another embodiment of the present invention includes the following steps. A substrate 200 is provided. The patterned amorphous carbon layer or spin-on coating layer 140 is formed. A surface of the substrate 200 is exposed at two sides of the amorphous carbon layer or spin-on coating layer 140. The interlayer dielectric layer 170 is formed on the substrate 200. A portion of the interlayer dielectric layer 170 is removed to expose the patterned amorphous carbon layer or spin-on coating layer 140. The patterned amorphous carbon layer or spin-on coating layer 140 is removed to form the opening 180. The opening 180 is filled with a conductive material to form the contact window 190.

The substrate 200 is, for example, a substrate having a semiconductor device formed thereon. An area for forming the amorphous carbon layer or spin-on coating layer 140 is properly selected depending on a position of the contact window to be formed.

Based on the above, the method for forming a contact window of the present invention is applicable not only to formation of the contact window in a memory, but also to formation of the contact window in common semiconductor fabrication processes. Furthermore, in the contact window formed by the method, the major axis direction is almost perpendicular to a substrate surface, and the contact window does not have an under-cut or side-etch/bowing profile. Therefore, short circuits between select gates and between bit-line contact windows in the memory, as a result of reduced size, do not easily occur.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A method for forming a contact window, comprising:
   providing a substrate;
   forming a patterned amorphous carbon layer or spin-on coating layer on the substrate, wherein a surface of the substrate is exposed at two sides of the amorphous carbon layer or spin-on coating layer, and the patterned amorphous carbon layer or spin-on coating layer directly contact with the substrate;
   forming an interlayer dielectric layer on the substrate;
   removing a portion of the interlayer dielectric layer to expose the patterned amorphous carbon layer or spin-on coating layer;
   removing the patterned amorphous carbon layer or spin-on coating layer to form an opening; and
   filling the opening with a conductive material to form a contact window.

2. The method for forming a contact window of claim 1, further comprising forming at least an anti-reflection layer on the substrate.

3. The method for forming a contact window of claim 2, wherein a material of the anti-reflection layer comprises silicon oxynitride.

4. The method for forming a contact window of claim 1, further comprising forming a liner layer on the substrate after forming the patterned amorphous carbon layer or spin-on coating layer and before forming the interlayer dielectric layer on the substrate.

5. The method for forming a contact window of claim 4, wherein a material of the liner layer comprises an oxide layer or silicon nitride layer formed by an atomic layer forming method.

6. The method for forming a contact window of claim 1, wherein a method for removing a portion of the interlayer dielectric layer to expose the patterned amorphous carbon layer or spin-on coating layer comprises a chemical mechanical polishing method.

7. The method for forming a contact window of claim 1, wherein the spin-on coating layer comprises a spin on hard mask (SOHM) layer and an under layer (UL).

8. The method for forming a contact window of claim 1, wherein a material of the interlayer dielectric layer comprises silicon oxide, silicon nitride, or silicon oxynitride.

9. The method for forming a contact window of claim 1, wherein a material of the conductive material is tungsten metal.

10. A method for forming a contact window of a memory, the method comprising:
    providing a substrate having a plurality of select gates of a memory formed thereon;
    forming a patterned amorphous carbon layer or spin-on coating layer between the plurality of select gates, and the patterned amorphous carbon layer or spin-on coating layer directly contact with the substrate;
    forming an interlayer dielectric layer on the substrate;
    removing a portion of the interlayer dielectric layer to expose the patterned amorphous carbon layer or spin-on coating layer;
    removing the patterned amorphous carbon layer or spin-on coating layer to form an opening; and
    filling the opening with a conductive material to form a contact window between the plurality of select gates.

11. The method for forming a contact window of a memory of claim 10, further comprising forming at least an anti-reflection layer on the substrate.

12. The method for forming a contact window of a memory of claim 11, wherein a material of the anti-reflection layer comprises silicon oxynitride.

13. The method for forming a contact window of a memory of claim 10, further comprising forming a liner layer on the substrate after forming the patterned amorphous carbon layer or spin-on coating layer between the plurality of select gates, and before forming the interlayer dielectric layer on the substrate.

14. The method for forming a contact window of claim 13, wherein a material of the liner layer comprises an oxide layer or silicon nitride layer formed by an atomic layer forming method.

15. The method for forming a contact window of a memory of claim 10, wherein a method for removing a portion of the interlayer dielectric layer to expose the patterned amorphous carbon layer or spin-on coating layer comprises a chemical mechanical polishing method.

16. The method for forming a contact window of a memory of claim 10, wherein a method for forming the patterned amorphous carbon layer or spin-on coating layer between the plurality of select gates comprises:
    forming the amorphous carbon layer or spin-on coating layer on the substrate; and
    patterning the amorphous carbon layer or spin-on coating layer to form the patterned amorphous carbon layer or spin-on coating layer between the plurality of select gates.

17. The method for forming a contact window of a memory of claim 10, wherein the spin-on coating layer comprises a spin on hard mask (SOHM) layer and an under layer (UL).

18. The method for forming a contact window of a memory of claim 10, wherein a material of the interlayer dielectric layer comprises silicon oxide, silicon nitride, or silicon oxynitride.

19. The method for forming a contact window of a memory of claim 10, wherein a material of the conductive material is tungsten metal.

* * * * *